US009502266B2

United States Patent
Ono et al.

(10) Patent No.: US 9,502,266 B2
(45) Date of Patent: Nov. 22, 2016

(54) SILICON WAFER AND METHOD OF MANUFACTURING THEREOF, AND METHOD OF MANUFACTURING SEMICONDUCTOR DEVICE

(75) Inventors: Toshiaki Ono, Tokyo (JP); Jun Fujise, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 139 days.

(21) Appl. No.: 13/576,853

(22) PCT Filed: Feb. 3, 2011

(86) PCT No.: PCT/JP2011/052277
§ 371 (c)(1),
(2), (4) Date: Aug. 2, 2012

(87) PCT Pub. No.: WO2011/096489
PCT Pub. Date: Aug. 11, 2011

(65) Prior Publication Data
US 2012/0306052 A1 Dec. 6, 2012

(30) Foreign Application Priority Data

Feb. 8, 2010 (JP) ................................ 2010-025487
Apr. 19, 2010 (JP) ................................ 2010-096505

(51) Int. Cl.
*H01L 21/02* (2006.01)
*H01L 21/00* (2006.01)
(Continued)

(52) U.S. Cl.
CPC ......... *H01L 21/3225* (2013.01); *H01L 21/268* (2013.01)

(58) Field of Classification Search
USPC ......... 438/501, 45, 473, 758, 795, 479, 446, 438/48
See application file for complete search history.

(56) References Cited

U.S. PATENT DOCUMENTS 6,478,883 B1  11/2002  Tamatsuka et al.
6,544,656 B1 *  4/2003  Abe et al. ..................... 428/446
(Continued)

FOREIGN PATENT DOCUMENTS

JP   9-223699 A    8/1997
JP   10-150048    6/1998
(Continued)

OTHER PUBLICATIONS

International Search Report issued with respect to PCT/JP2011/052277, mailed Mar. 29, 2011.
(Continued)

*Primary Examiner* — Selim Ahmed
*Assistant Examiner* — Moin Rahman
(74) *Attorney, Agent, or Firm* — Greenblum & Bernstein, P.L.C.

(57) ABSTRACT

An object of the present invention is to provide an epitaxial wafer on which dislocation is preventable even when a LSA treatment is performed in device processes. An epitaxial wafer according to the present invention includes a wafer 11 whose nitrogen concentration is $1 \times 10^{12}$ atoms/cm$^3$ or more or whose specific resistance is 20 mΩ·cm or less by boron doping, and an epitaxial layer 12 provided on the wafer 11. On the wafer 11, if a thermal treatment is performed at 750° C. for 4 hours and then at 1,000° C. for 4 hours, polyhedron oxygen precipitates grow predominantly over plate-like oxygen precipitates. Therefore, in the device processes, plate-like oxygen precipitates cannot be easily formed. As a result, even when the LSA treatment is performed after various thermal histories in the device processes, it is possible to prevent the dislocation, which is triggered by oxygen precipitates, from generating.

14 Claims, 3 Drawing Sheets

(51) Int. Cl.
*H01L 21/322* (2006.01)
*H01L 21/268* (2006.01)

(56) References Cited

U.S. PATENT DOCUMENTS

| | | | |
|---|---|---|---|
| 7,700,394 B2 | 4/2010 | Sadamitsu et al. | |
| 2002/0142171 A1* | 10/2002 | Asayama et al. | 428/446 |
| 2007/0059904 A1* | 3/2007 | Izumome | C30B 15/00 438/487 |
| 2007/0218570 A1 | 9/2007 | Nakamura et al. | |
| 2008/0118424 A1* | 5/2008 | Sadamitsu et al. | 423/324 |
| 2008/0197457 A1 | 8/2008 | Ono et al. | |
| 2008/0292523 A1* | 11/2008 | Ono et al. | 423/348 |
| 2009/0146181 A1* | 6/2009 | Lai et al. | 257/190 |

FOREIGN PATENT DOCUMENTS

| | | |
|---|---|---|
| JP | 11-150119 | 6/1999 |
| JP | 2008-205024 | 9/2008 |
| KR | 10-2007-0023819 | 2/2007 |
| WO | 2006/003812 | 1/2006 |

OTHER PUBLICATIONS

Korea Office action, dated Jul. 8, 2013 along with a partial English translation thereof, in patent family application No. KR20127018331.
International Preliminary Report on Patentability for PCT/JP2011/052277, mailed Sep. 18, 2012.
Japanese Office Action issued for Application No. 2014-117540, mail date is Jun. 30, 2015.
German Office Action for File No. 11 2011 100 479.6, dated Feb. 24, 2014; along with an English translation thereof.

* cited by examiner

SILICON WAFER AND METHOD OF MANUFACTURING THEREOF, AND METHOD OF MANUFACTURING SEMICONDUCTOR DEVICE

TECHNICAL FIELD

The present invention relates to a silicon wafer and a manufacturing method thereof, and particularly to a silicon wafer that is used for device processes including a LSA (Laser Spike Anneal) treatment, and a manufacturing method thereof. Moreover, the present invention relates to a manufacturing method of a semiconductor device, and particularly to a manufacturing method of a semiconductor device including LSA treatment.

DESCRIPTION OF RELATED ART

In manufacturing processes (or so-called device processes) of a semiconductor device, various kinds of thermal treatments are performed on a silicon wafer. For example, in order to form a source/drain region of a MOS transistor, after the ion implantation of dopants into the silicon wafer is carried out, annealing is carried out to activate the dopants. As for the annealing for activating dopants, a method of heating the entire surface of the wafer with a lamp furnace or the like is generally used.

However, in recent years, a channel length of a MOS transistor has been so designed as to be very short. The problem thereof is an increase in sub-threshold current due to a short channel effect. To suppress the short channel effect, an operation of forming a source/drain region through ultra-shallow junction with a steep impurity profile is effective. As an annealing method to achieve such ultra-shallow junction, the LSA (Laser Spike Anneal) treatment has gained attention.

The LSA treatment is different from a method of heating the entire surface of the wafer with a lamp furnace or the like, and is carried out by scanning the wafer with a laser beam whose beam diameter is about several millimeters. As a result, a region irradiated with the laser beam reaches, on the order of milliseconds or less, a temperature that is greater than or equal to 1,000° C. and less than or equal to a melting point (1,414° C.). Therefore, it is possible to obtain a steep impurity profile. However, in the LSA treatment, a steep temperature gradient is formed not only in the thickness direction of the wafer but also in the in-plane direction, causing strong thermal stress inside the wafer. If strong thermal stress occurs in the wafer, oxygen precipitates could be a trigger for dislocation. If dislocation occurs in the device processes, then a difference emerges in alignment between before and after the dislocation. As a result, in a photolithography process, a so-called overlay error occurs.

As a method to prevent the dislocation triggered by oxygen precipitates, the methods disclosed in Patent Documents 1 to 3 are known. What is disclosed in Patent Document 1 is a method of including carbon in a silicon wafer so that the shape of oxygen precipitates is turned into a polyhedron, not a plate, thereby preventing the dislocation associated with thermal stress. What is disclosed in Patent Document 2 is a method of making a region extending to a depth of 25 μm to 100 μm from the outer layer of a silicon wafer free of light scattering defects, while causing a region at a depth of 100 μm to include a large number of light scattering defects. Furthermore, what is disclosed in Patent Document 3 is a method of setting the following factors within predetermined ranges: the size and density of oxygen precipitates at the time of thermal treatment, and thermal stress imposed by the thermal treatment.

PRIOR ART DOCUMENTS

Patent Document 1: Japanese Patent Application Laid-Open No. H10-150048

Patent Document 2: Japanese Patent Application Laid-Open No. 2008-205024

Patent Document 3: Japanese PCT National Republication No. 2006-3812

DISCLOSURE OF THE INVENTION

Problems to be Solved by the Invention

Meanwhile, among silicon wafers, there is an epitaxial wafer having an epitaxial layer formed on a surface thereof. In order to increase the gettering ability of the epitaxial wafer, it is effective for high concentrations of nitrogen or boron to be contained in the wafer.

However, in the wafer doped with high concentrations of nitrogen or boron, when being compared with a typical wafer, oxygen precipitates are quite easily formed in device processes. The reason is that nitrogen and boron have an effect of increasing the stability of the precipitate nuclei. Therefore, when such an epitaxial wafer is put into the device processes, plate-like fine precipitates are easily formed due to low-temperature treatment of about 750° C., which is included in the device processes; the fine precipitates then grow as thermal treatment of about 1,000° C. is carried out, resulting in large plate-like oxygen precipitates. After plate-like oxygen precipitates have grown as described above, dislocation can easily occur due to the oxygen precipitates that act as a trigger when the LSA treatment is performed. The problem is that the dislocation reaches the epitaxial layer. The reason why the dislocation easily occurs in the LSA treatment is that, compared with other kinds of thermal treatment, extremely strong thermal stress is applied locally in the LSA treatment. Accordingly, for a silicon wafer where plate-like oxygen precipitates can easily grow, like an epitaxial wafer doped with high concentrations of nitrogen or boron, it is particularly important to prevent the dislocation associated with the LSA treatment.

The above problem may not be solved by the methods disclosed in the above Patent Documents 1 to 3.

That is, according to Patent Document 1, as carbon is contained in the silicon wafer, the shape of oxygen precipitates can be turned into a polyhedron. However, it remains to be seen whether the method of Patent Document 1 is effective for a wafer doped with high concentrations of nitrogen or boron, such as an epitaxial wafer. Moreover, as described in paragraph [0004] of Patent Document 1, a batch furnace or the like is supposed to be used in thermal treatment; the case where strong thermal stress could occur in the thickness and in-plane directions of the wafer, as in the case of the LSA treatment, was not foreseen. Therefore, it is considered that, when the LSA treatment is performed on an epitaxial wafer doped with high concentrations of nitrogen or boron, it would be difficult to prevent dislocation by the method disclosed in Patent Document 1.

The same is true for Patent Documents 2 and 3; it remains to be seen whether dislocation is preventable when the LSA treatment is performed on the above-described epitaxial wafer. It is considered that dislocation may be unpreventable.

As described above, conventionally, it is difficult to prevent dislocation when the LSA treatment is carried out in the device processes for an epitaxial wafer having a wafer doped with high concentrations of nitrogen or boron.

Therefore, an object of the present invention is to provide an epitaxial wafer having a wafer doped with high concentrations of nitrogen or boron, and a manufacturing method thereof, as well as a silicon wafer on which dislocation is preventable even when the LSA treatment is performed in the device processes, and a manufacturing method thereof.

Another object of the present invention is to provide a manufacturing method of a semiconductor device that uses such a silicon wafer, as well as a manufacturing method of a semiconductor device by which dislocation is prevented during the LSA treatment.

Meanwhile, conventionally, the conditions under which the LSA treatment is carried out in a way that prevents dislocation on such an epitaxial wafer as well as on a silicon wafer containing plate-like oxygen precipitates have been unknown.

That is, the invention of Patent Document 1 is for eliminating plate-like oxygen precipitates. Therefore, the conditions under which the LSA treatment actually should be carried out on a silicon wafer containing plate-like oxygen precipitates are unclear from Patent Document 1.

According to Patent Document 2, a flashlamp annealing device is supposed to be used as a rapid thermal processing device. Therefore, few temperature gradients occur in the in-plane direction of a wafer. Therefore, it is unclear whether the invention disclosed in Patent Document 2 is effective for the LSA treatment that causes a steep temperature gradient in the in-plane direction. Even if the invention is effective for the LSA treatment, it is unclear from Patent Document 2 what conditions of the LSA treatment should be set for a silicon wafer containing plate-like oxygen precipitates to prevent dislocation.

Patent Document 3 discloses the conditions for carrying out flashlamp annealing and spike-lamp annealing. However, as in Patent Document 2, it is unclear whether the conditions are effective for the LSA treatment. Even if the conditions are effective, it is unclear from Patent Document 3 what conditions of the LSA treatment should be set for a silicon wafer containing plate-like oxygen precipitates to prevent dislocation.

Thus, still another object of the present invention is to provide a silicon wafer containing plate-like oxygen precipitates, and a manufacturing method thereof, as well as a silicon wafer on which dislocation is preventable even when the LSA treatment is performed in the device processes, and a manufacturing method thereof.

Means for Solving the Problems

The present inventors conducted extensive studies as to what conditions should be met for oxygen precipitates to trigger dislocation at a time when LSA treatment is performed on a silicon wafer, or particularly on an epitaxial wafer doped with high concentrations of nitrogen or boron. As a result, it was found that whether or not dislocation is triggered by oxygen precipitates is strongly dependent on the correlation between the maximum temperature of the LSA treatment and the size of plate-like oxygen precipitates. Moreover, if the silicon wafer is subjected to a predetermined type of thermal treatment before being put into device processes, plate-like oxygen precipitates cannot be easily formed in the device processes. It was also found that, even if plate-like oxygen precipitates are formed in the device processes as a result, the average size thereof is significantly reduced. The present invention has been made based on the above technical findings.

That is, according to one aspect of the present invention, a silicon wafer is characterized by comprising: a wafer whose nitrogen concentration is $1 \times 10^{12}$ atoms/cm$^3$ or more or whose specific resistance is 20 mΩ·cm or less by boron doping; and an epitaxial layer which is provided on a surface of the wafer, in which, if thermal treatment is performed on the wafer at 750° C. for 4 hours and then at 1,000° C. for 4 hours, polyhedron oxygen precipitates grow predominantly over plate-like oxygen precipitates.

According to the present invention, plate-like oxygen precipitates cannot be easily formed in the device processes. Therefore, even when the LSA treatment is performed after various thermal histories in the device processes, it is possible to prevent the dislocation, which is triggered by oxygen precipitates, from generating. In this case, the reason why polyhedron oxygen precipitates grow predominantly over plate-like oxygen precipitates at a time when thermal treatment is performed at 750° C. for 4 hours and then at 1,000° C. for 4 hours is that the silicon wafer of the present invention contains larger amounts of precipitate nuclei of a type that grows into polyhedron oxygen precipitates than precipitate nuclei of a type that grows into plate-like oxygen precipitates. However, with the current analysis technology, it is impossible to figure out which type of precipitate nuclei is contained larger in amount than the other before precipitate nuclei are actually grown by thermal treatment. However, if predetermined treatment is applied to the silicon wafer in advance, polyhedron oxygen precipitates can grow predominantly over plate-like oxygen precipitates after the above thermal treatment. A manufacturing method of silicon wafer of the present invention has the above point as a feature.

That is, according to one aspect of the present invention, a manufacturing method of silicon wafer is characterized by comprising: a process of forming an epitaxial layer on a surface of a wafer whose nitrogen concentration is $1 \times 10^{12}$ atoms/cm$^3$ or more or whose specific resistance is 20 mΩ·cm or less by boron doping; and a process of raising, after the formation of the epitaxial layer, a temperature at a rate of 5° C. per minute or more within a temperature range that is greater than or equal to at least 800° C., and heating at a temperature that is greater than or equal to 1,050° C. and less than or equal to a melting point for 5 minutes or more.

According to the present invention, as the above thermal treatment is conducted, a larger amount of precipitate nuclei of a type that grows into a polyhedron is formed. Therefore, even if the device processes go through various thermal histories, the percentage of plate-like oxygen precipitates becomes very small. Thus, even when the LSA treatment is performed, it is possible to prevent the dislocation, which is triggered by oxygen precipitates, from generating.

A manufacturing method of semiconductor device of the present invention, which includes a wafer process of producing a silicon wafer and a device process of forming a semiconductor device on the silicon wafer, is characterized in that: the wafer process includes a process of forming an epitaxial layer on a surface of a wafer whose nitrogen concentration is $1 \times 10^{12}$ atoms/cm$^3$ or more or whose specific resistance is 20 mΩ·cm or less by boron doping, and a process of raising, after the formation of the epitaxial layer, a temperature at a rate of 5° C. per minute or more within a temperature range that is greater than or equal to at least 800° C., and heating at a temperature that is greater than or equal to 1,050° C. and less than or equal to a melting point for 5 minutes or more; and the device process includes a process of performing LSA (Laser Spike Anneal) treatment, which is so performed as to satisfy the following condition when a diagonal length of plate-like oxygen precipitates contained in the wafer is represented by S (nm), and a maximum temperature by T (° C.):

$$T \times S^2 \leq 9 \times 10^6$$

According to the present invention, since the LSA treatment is performed under the above condition, even when the wafer contains plate-like oxygen precipitates, it is possible to prevent the dislocation, which is triggered by the plate-like oxygen precipitates, from generating. In this case, the diagonal length of plate-like oxygen precipitates means the average value of the diagonal lengths of many plate-like oxygen precipitates contained in the wafer.

According to another aspect of the present invention, a silicon wafer, which is subjected to device processes including LSA (Laser Spike Anneal) treatment, is characterized by satisfying the following condition during the LSA treatment when a diagonal length of plate-like oxygen precipitates contained in the silicon wafer is represented by S (nm), and a maximum temperature by T (° C.):

$$T \times S^2 \leq 9 \times 10^6$$

According to another aspect of the present invention, a manufacturing method of silicon wafer, which is subjected to device processes including LSA (Laser Spike Anneal) treatment, is characterized by satisfying the following condition during the LSA treatment when a diagonal length of plate-like oxygen precipitates contained in the silicon wafer is represented by S (nm), and a maximum temperature by T (° C.):

$$T \times S^2 \leq 9 \times 10^6$$

According to another aspect of the present invention, by performing LSA treatment under the above condition, it is possible to prevent the dislocation, which is triggered by plate-like oxygen precipitates, from generating.

According to still another aspect of the present invention, a silicon wafer, which is subjected to device processes including LSA treatment, is characterized by comprising: a wafer whose nitrogen concentration is $1 \times 10^{12}$ atoms/cm$^3$ or more or whose specific resistance is 20 mΩ·cm or less by boron doping; and an epitaxial layer which is provided on a surface of the wafer, in which an initial oxygen concentration of the wafer is less than or equal to $14 \times 10^{17}$ atoms/cm$^3$.

According to still another aspect of the present invention, a manufacturing method of silicon wafer, which is subjected to device processes including LSA treatment, is characterized by comprising: a process of using Czochralski method to grow a silicon single crystal whose nitrogen concentration is $1 \times 10^{12}$ atoms/cm$^3$ or more or whose specific resistance is 20 mΩ·cm or less by boron doping, and whose initial oxygen concentration is $14 \times 10^{17}$ atoms/cm$^3$ or less; and a process of forming an epitaxial layer on a surface of a wafer cut out from the silicon single crystal.

According to still another aspect of the present invention, even when plate-like oxygen precipitates grow before LSA treatment due to typical thermal treatment, which is performed before LSA treatment, it is possible to prevent the occurrence of dislocation caused by typical LSA treatment whose maximum temperature is about 1,250° C. As for the typical thermal treatment that is performed before the LSA treatment, for example, the following thermal treatment is available: thermal treatment that is kept at a temperature of 750° C. or more for 3 hours or more, containing a process of being kept at a temperature range of 1,000 to 1,050° C. for one hour or more.

According to the present invention, it is preferred that the initial oxygen concentration of the wafer be less than or equal to $12 \times 10^{17}$ atoms/cm$^3$. Therefore, even when thermal treatment is performed for a longer period of time before the LSA treatment, it is possible to prevent the occurrence of dislocation caused by typical LSA treatment whose maximum temperature is about 1,250° C. As for the longer-period thermal treatment, for example, the following is available: thermal treatment with a temperature of 750° C. or more for 4 hours or more, containing a process of being kept at a temperature range of 1,000 to 1,050° C. for 2 hours or more.

Advantages of the Invention

As described above, according to one aspect of the present invention, it is possible to provide an epitaxial wafer having a wafer doped with high concentrations of nitrogen or boron, as well as a silicon wafer on which dislocation is preventable even when the LSA treatment is performed in the device processes.

According to one aspect of the present invention, it is possible to provide a manufacturing method of an epitaxial wafer having a wafer doped with high concentrations of nitrogen or boron, as well as a manufacturing method of a silicon wafer on which dislocation is preventable even when the LSA treatment is performed in the device processes.

Furthermore, according to one aspect of the present invention, it is possible to provide a manufacturing method of a semiconductor device using an epitaxial wafer doped with high concentrations of nitrogen or boron, as well as a manufacturing method of a semiconductor device on which the LSA treatment does not trigger dislocation.

According to another aspect of the present invention, the LSA treatment is performed under a predetermined condition. Therefore, it is possible to prevent the dislocation, which is triggered by plate-like oxygen precipitates, from generating.

According to still another aspect of the present invention, even when plate-like oxygen precipitates grow before the LSA treatment, it is possible to prevent the occurrence of dislocation caused by the LSA treatment.

DETAILED DESCRIPTION OF THE EMBODIMENTS

Preferred embodiments of the present invention will be explained below in detail with reference to the accompanying drawings.

Figure 1:
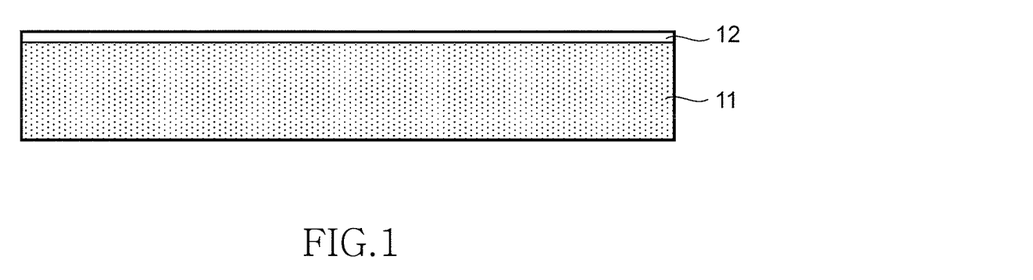
FIG. 1 is a schematic cross-sectional view showing the configuration of a silicon wafer according to a preferred embodiment of the present invention.

FIG. 1 is a schematic cross-sectional view showing the configuration of a silicon wafer 10 according to a preferred embodiment of the present invention.

As shown in FIG. 1, the silicon wafer 10 of the present embodiment includes a wafer 11 and an epitaxial layer 12, which is formed on a surface of the wafer 11. The wafer 11 is single crystal silicon grown by the Czochralski method, playing a role in securing the mechanical strength of the silicon wafer 10 and serving as a gettering source of heavy metals. The thickness of the wafer 11 is not specifically restricted as long as the mechanical strength is ensured; the thickness of the wafer 11 is about 725 μm, for example.

It is preferred that the wafer 11 be doped with nitrogen or boron. If it is nitrogen that the wafer 11 is doped with, the concentration thereof is preferably $1 \times 10^{12}$ atoms/cm$^3$ or more. If it is boron that the wafer 11 is doped with, it is preferred that the specific resistance of the wafer 11 be set to 20 mΩ·cm or less as a result of boron doping. The reason why the wafer 11 is doped with the above-mentioned concentrations of nitrogen or boron is that a sufficient gettering ability is given to the wafer 11. The upper limits of the concentrations of nitrogen or boron are not specifically restricted. However, as for nitrogen, the upper limit is preferably $5 \times 10^{14}$ atoms/cm$^3$ or less; as for boron, in the form of specific resistance, the upper limit is preferably set to 3 mΩ·cm or more. The reason is that, if the concentration of nitrogen rises above $5 \times 10^{14}$ atoms/cm$^3$, dislocating could easily occur during a single crystal growth process; and that, if the specific resistance is less than 3 mΩ·cm in the case of boron, misfit dislocation could easily occur due to a lattice mismatch with the growing epitaxial layer.

It is preferred that the initial oxygen concentration of the wafer 11 be greater than or equal to $7 \times 10^{17}$ atoms/cm$^3$ and less than or equal to $2.4 \times 10^{18}$ atoms/cm$^3$. The reason is that, if the oxygen concentration is less than $7 \times 10^{17}$ atoms/cm$^3$, the formation density of oxygen precipitates required for gettering of heavy metals such as Ni can be insufficient. Moreover, if the oxygen concentration is over $2.4 \times 10^{18}$ atoms/cm$^3$, it is difficult to form a defect-free epitaxial layer 12. However, if doping of nitrogen or boron has been done, nitrogen- or boron-doping promotes the formation of oxygen precipitates. Therefore, as long as oxygen precipitates have been formed by thermal treatment, the initial oxygen concentration of the wafer 11 can be less than $7 \times 10^{17}$ atoms/cm$^3$. Incidentally, all the oxygen concentrations described in the present specification are measured by Fourier transform infrared spectroscopy (FT-IR), standardized in ASTM F-121 (1979).

Moreover, in the device processes, suppose that the following thermal treatment is carried out: the thermal treatment by which precipitate nuclei can grow before the LSA treatment, which is, for example, thermal treatment in which a temperature of 750° C. or more is kept for 3 hours or more and which includes a process in which a temperature range of 1,000 to 1,050° C. is kept for 1 hour or more. In this case, it is preferred that the initial oxygen concentration of the wafer 11 be less than or equal to $14 \times 10^{17}$ atoms/cm$^3$. Furthermore, suppose that the following thermal treatment is carried out: the thermal treatment that takes place for a longer period of time before the LSA treatment, which is, for example, thermal treatment in which a temperature of 750° C. or more is kept for 4 hours or more and which includes a process in which a temperature range of 1,000 to 1,050° C. is kept for 2 hours or more. In this case, it is preferred that the initial oxygen concentration of the wafer 11 be less than or equal to $12 \times 10^{17}$ atoms/cm$^3$. The reason is that the size of plate-like oxygen precipitates formed by thermal treatment is determined by thermal-treatment conditions (temperature and time) and the initial oxygen concentration of the wafer 11. Assume that the above-described typical thermal treatment is carried out. In this case, if the initial oxygen concentration of the wafer 11 is set to $14 \times 10^{17}$ atoms/cm$^3$ or less, the size of plate-like oxygen precipitates right before the LSA treatment can be kept less than or equal to a predetermined value. Furthermore, suppose that the above-described longer-period thermal treatment is carried out. In this case, if the initial oxygen concentration of the wafer 11 is set to $12 \times 10^{17}$ atoms/cm$^3$ or less, the size of plate-like oxygen precipitates right before the LSA treatment can be kept less than or equal to a predetermined value. The initial oxygen concentrations may be adjusted by convection control of the silicon melt or the like at a time when the silicon single crystal is grown by the Czochralski method. The correlation between the size of plate-like oxygen precipitates and whether or not dislocation occurs will be described later.

If the wafer 11 is doped with high concentrations of nitrogen or boron, semiconductor devices such as MOS transistors cannot be formed directly on the wafer 11. The semiconductor devices such as MOS transistors are formed on the epitaxial layer 12 on top of the wafer 11. The specific resistance of the epitaxial layer 12 is usually set higher than the specific resistance of the wafer 11. The film thickness of the epitaxial layer 12 is not specifically restricted; the film thickness of the epitaxial layer 12 may be so set as to be greater than or equal to 1 μm and less than or equal to about 10 μm.

Figure 2:
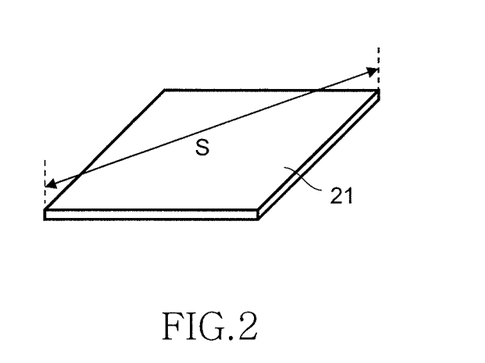
FIG. 2 is a schematic perspective view for explaining a structure of a plate-like oxygen precipitate.
Figure 3:
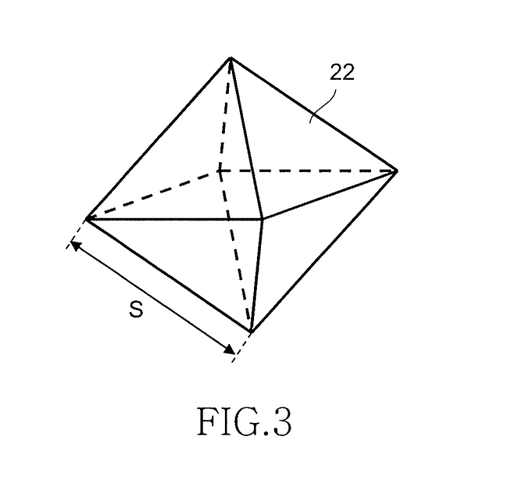
FIG. 3 is a schematic perspective view for explaining a structure of a Polyhedron oxygen precipitate.

On the silicon wafer 10 having such a configuration, when thermal treatment is performed at a temperature of 750° C. for 4 hours followed by another thermal treatment at a temperature of 1,000° C. for 4 hours, polyhedron oxygen precipitates grow predominantly over plate-like oxygen precipitates on the wafer 11. Plate-like oxygen precipitates are mainly oxygen precipitates having the structure shown in FIG. 2; a principal surface 21 thereof runs along [100] plane, [010] plane, or [001] plane. The size of plate-like oxygen precipitates is defined by diagonal length S. Polyhedron oxygen precipitates are mainly octahedral oxygen precipitates having the structure shown in FIG. 3; each surface 22 thereof runs along [111] plane. The size of polyhedron oxygen precipitates is determined by the length of one side S.

Figure 4:
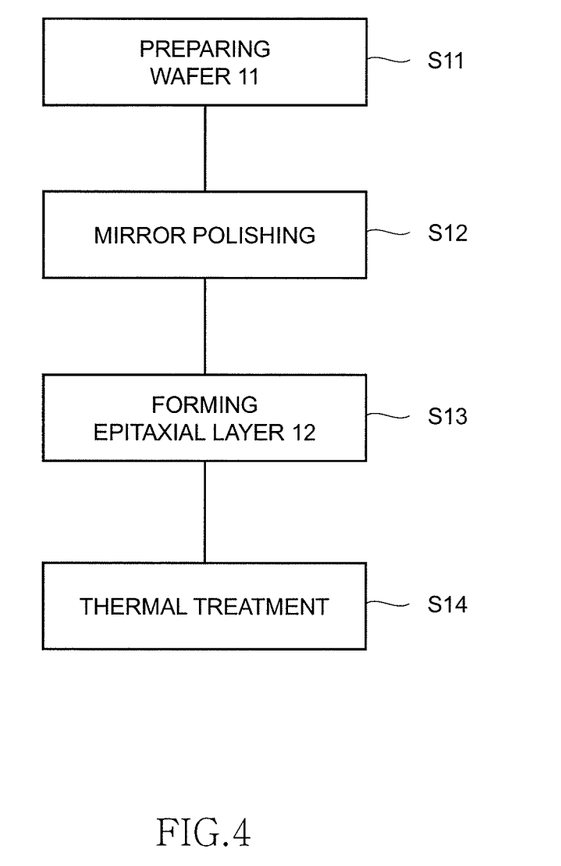
FIG. 4 is a flowchart illustrating a manufacturing method (wafer process) of the silicon wafer.

FIG. 4 is a flowchart illustrating a manufacturing method (wafer process) of the silicon wafer 10 according to the present embodiment.

As shown in FIG. 4, a wafer 11, which is cut out from a silicon single crystal ingot, is prepared (Step S11), and a surface thereof is mirror-polished (Step S12). The silicon single crystal ingot is grown by the Czochralski method; the wafer 11 therefore contains oxygen in a supersaturated manner that is eluted from a quartz crucible. As described above, the initial concentration of oxygen contained in the wafer 11 is preferably set to $14 \times 10^{17}$ atoms/cm$^3$ or less, or more preferably $12 \times 10^{17}$ atoms/cm$^3$ or less. Then, on the mirror-polished surface of the wafer 11, an epitaxial layer 12 is formed (Step S13).

Then, as thermal treatment is performed, precipitate nuclei of a type that grows into polyhedron oxygen precipitates are formed (Step S14). During the thermal treatment, within a temperature range that is greater than or equal to at least 800° C., the temperature rises at a rate of 5° C. per minute or more; and then the temperature is kept greater than or equal to 1,050° C. and less than or equal to the melting point for 5 minutes or more. As a result, the oxygen contained in the wafer 11 forms the precipitate nuclei.

However, if the temperature is less than 1,050° C. at a time when precipitate nuclei are formed, precipitate nuclei of a type that grows into plate-like oxygen precipitates are formed predominantly. If precipitate nuclei are formed within the above temperature range, precipitate nuclei of a type that grows into polyhedron oxygen precipitates are formed predominantly. However, with the current technology, it is impossible to make a determination as to which type the precipitate nuclei are before the precipitate nuclei are actually grown up.

The reason why the time during which the temperature is kept greater than or equal to 1,050° C. and less than or equal to the melting point is 5 minutes or more is as follows: If the temperature-retention time is less than 5 minutes, precipitate nuclei of a type that grows into polyhedron oxygen precipitates are not formed sufficiently. It is preferred that the temperature-retention time be 2 hours or less. The reason is that, even if thermal treatment is carried out for more than 2 hours, any improved effects cannot be obtained; and the cost of producing wafers increases significantly when the temperature-retention time is more than 2 hours.

The reason why the temperature-rising rate is set to 5° C. per minute or more within the temperature range greater than or equal to 800° C. is that it is necessary to shorten the time required to pass through the temperature range that is greater than or equal to 800° C. and less than 1,050° C., i.e. the temperature range in which precipitate nuclei of a type that grows into plate-like oxygen precipitates are formed predominantly. That is, if the temperature-rising rate is less than 5° C. per minute within the temperature range greater than or equal to 800° C., a large amount of precipitate nuclei of a type that grows into plate-like oxygen precipitates is formed by the time when the retention temperature (greater than or equal to 1,050° C. and less than or equal to the melting point) is reached. After that, even if the temperature is kept greater than or equal to 1,050° C. and less than or equal to the melting point, precipitate nuclei of a type that grows into polyhedron oxygen precipitates do not become predominant. The upper limit of the temperature-rising rate is not specifically restricted; however, the upper limit is preferably less than or equal to 10° C. per minute. The reason is that, if the temperature rises at a rate of over 10° C. per minute, the thermal stress increases due to in-plane temperature differences of the wafer, possibly causing slip dislocation to occur significantly. The temperature range in which the temperature-rising rate is set to 5° C. per minute or more is not specifically restricted as long as the temperature range is at least 800° C.; it is preferred that the temperature-rising rate be set to 5° C. per minute or more within the temperature range that is greater than or equal to 700° C. Therefore, it is possible to more effectively prevent the formation of precipitate nuclei of a type that grows into plate-like oxygen precipitates.

According to the procedure described above, the silicon wafer 10 of the present embodiment is completed. The silicon wafer 10 produced by the above-described wafer processes is put into device processes in which semiconductor devices are formed on the epitaxial layer 12.

Figure 5:
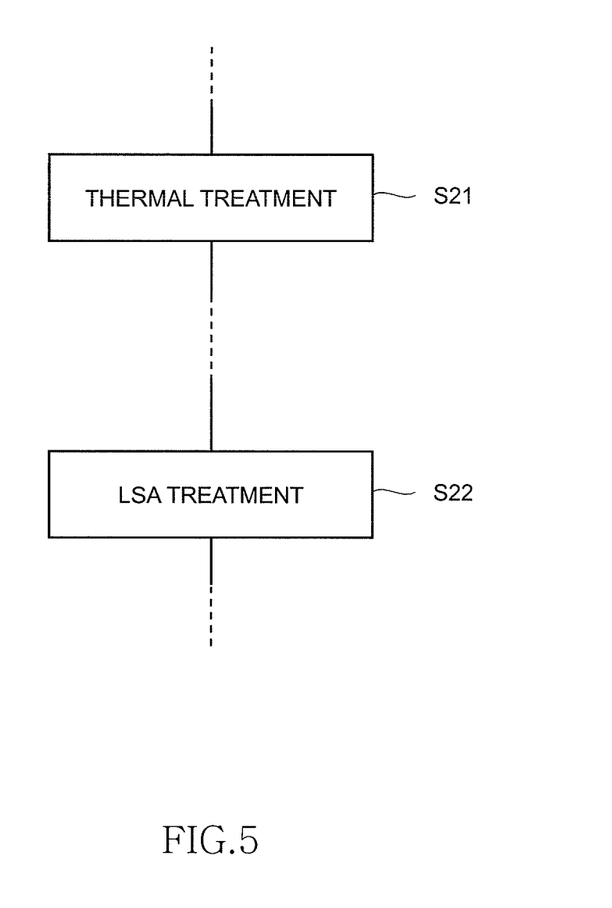
FIG. 5 is a flowchart showing some of the device processes.

FIG. 5 is a flowchart showing some of the device processes.

The device processes include various processes depending on the type of a semiconductor device to be produced (a logic-based device, memory-based device, or the like). However, as shown in FIG. 5, the device processes may include a thermal treatment process (Step S21), in which the temperature is increased to a point at which precipitate nuclei can grow; and an LSA treatment process (Step S22).

One example of the thermal treatment process at step S21 is as follows: a process of heating at 850° C. for 30 minutes, followed by a process of heating at 900° C. for 30 minutes, a process of heating at 1,000° C. for 100 minutes, and a process of heating at 950° C. for 30 minutes in that order. In this case, the thermal treatment process at step S21 enables the precipitate nuclei contained in the wafer 11 to grow into oxygen precipitates. The oxygen precipitates formed contain plate-like and polyhedron oxygen precipitates. However, because the silicon wafer 10 of the present embodiment has been subjected to the thermal treatment process (Step S14) in the wafer processes as shown in FIG. 4, and because precipitate nuclei of a type that grows into polyhedron oxygen precipitates are predominant, the predominant oxygen precipitates formed by the thermal treatment process at step S21 are polyhedron oxygen precipitates. When a comparison is made between the plate-like and polyhedron oxygen precipitates of the same volume, the stress of the polyhedron oxygen precipitates is smaller than the plate-like oxygen precipitates; the polyhedron oxygen precipitates are not likely to be a trigger for dislocation.

After polyhedron oxygen precipitates are formed by the above thermal treatment process (Step S21), the LSA treatment (Step S22) is carried out, applying strong thermal stress to the wafer 11. As a result, the oxygen precipitates may trigger dislocation. The LSA treatment is performed by scanning the epitaxial layer 12 of the silicon wafer 10 with a laser beam having a beam diameter of several millimeters, with the silicon wafer 10 initially heated to about 400 to 600° C. As a result, a region irradiated with the laser beam reaches, on the order of milliseconds or less, a temperature that is greater than or equal to 1,000° C. and less than or equal to the melting point. Therefore, it is possible to obtain a steep impurity profile.

In the LSA treatment, strong thermal stress is applied to the wafer 11 in the depth and in-plane directions. However, according to the present embodiment, the predominant oxygen precipitates formed by the thermal treatment process at step S21 are polyhedron oxygen precipitates. Therefore, even if strong thermal stress is applied by the LSA treatment, dislocation is not triggered by the oxygen precipitates. To be sure, the wafer 11 also may contain plate-like oxygen precipitates to some extent. However, precipitate nuclei of a type that grows into plate-like oxygen precipitates are relatively small in amount. Therefore, even if plate-like oxygen precipitates are formed, the size of the plate-like oxygen precipitates is small, and the formation density of the plate-like oxygen precipitates is sufficiently low.

Even if the wafer 11 contains plate-like oxygen precipitates, it is possible to prevent the dislocation, which is triggered by the plate-like oxygen precipitates, from generating by setting conditions of the LSA treatment within a predetermined range. More specifically, if the diagonal length of plate-like oxygen precipitates contained in the wafer 11 is represented by S (nm), and the maximum temperature by T (° C.), the LSA treatment is so performed as to satisfy the following condition:

$$T \times S^2 \leq 9 \times 10^6$$

As a result, little dislocation is triggered by plate-like oxygen precipitates. It is unclear as to the reason why the value ($=9 \times 10^6$) shown in the above formula is a threshold value. However, the value is backed up by reams of experimental data described later.

If the thermal treatment of step S14 shown in FIG. 4 is omitted, the predominant oxygen precipitates formed by the thermal treatment process of step S21 are plate-like oxygen precipitates. After plate-like oxygen precipitates are formed by the above thermal treatment process (Step S21), the LSA treatment (Step S22) is carried out, applying strong thermal stress to the wafer 11. As a result, the oxygen precipitates may trigger dislocation. Even in this case, if the diagonal length of plate-like oxygen precipitates contained in a region extending to a depth of 50 μm or less from the outer layer of the wafer 11 is represented by S (nm), and the maximum temperature by T (° C.), the LSA treatment is so performed as to satisfy the following condition:

$$T \times S^2 \leq 9 \times 10^6$$

As a result, little dislocation is triggered by plate-like oxygen precipitates.

The above has described the preferred embodiment of the present invention. However, the present invention is not limited to the above-described embodiment. Needless to say, various modifications may be made without departing from the subject matter of the present invention, and are also within the scope of the present invention.

For example, in the above embodiment, an example of using the epitaxial wafer is described. However, the target to which the present invention is applied is not limited to the epitaxial wafer.

EXAMPLES

Example 1

A plurality of polished wafers with an interstitial oxygen concentration of $12.5 \times 10^{17}$ atoms/cm$^3$ and a diameter of 300 mm were prepared. The wafers were subjected to various kinds of thermal treatments, and oxygen precipitates of different sizes and shapes were formed. The sizes and shapes of the precipitates were identified as different samples to which the same kinds of thermal treatment were applied were measured and observed under a transmission electron microscope (TEM). Table 1 shows the sizes and shapes of the precipitates that exist in a region extending to a depth of 50 μm or less from the outer layer of the wafer.

Then, the LSA treatment was applied to each wafer on which precipitates were formed. The maximum temperature on the wafer surface of each sample is shown in Table 1. After the LSA treatment, an X-ray topography device was used to confirm whether or not dislocation had occurred.

As a result, as shown in Table 1, in Samples 1 to 24 whose oxygen precipitates were in a plate-like shape, dislocation did not occur when the value given by $T \times S^2$ was less than or equal to $9 \times 10^6$. However, in Samples 6, 12, 17, 18, 23 and 24 in which the value given by $T \times S^2$ was over $9 \times 10^6$, dislocation occurred. Thus, the experiment proved that, if the LSA treatment is so performed as to satisfy the following condition, dislocation is not triggered by plate-like oxygen precipitates:

$$T \times S^2 \leq 9 \times 10^6$$

Meanwhile, in Samples 25 to 33 whose oxygen precipitates were in a polyhedron shape, dislocation did not occur regardless of the value of $T \times S^2$.

TABLE 1

| | SIZES OF OXYGEN PRECIPITATES S (nm) | SHAPES OF THE PRECIPITATES | MAXIMUM TEMPERATURE OF THE LSA TREATMENT T (° C.) | DISLOCATION | $S^2 \ast T$ |
|---|---|---|---|---|---|
| SAMPLE 1 | 10 | PLATE-LIKE | 1100 | NO | 1.10E+05 |
| SAMPLE 2 | 21 | PLATE-LIKE | 1100 | NO | 4.85E+05 |
| SAMPLE 3 | 47 | PLATE-LIKE | 1100 | NO | 2.43E+06 |
| SAMPLE 4 | 63 | PLATE-LIKE | 1100 | NO | 4.37E+06 |
| SAMPLE 5 | 85 | PLATE-LIKE | 1100 | NO | 7.95E+06 |
| SAMPLE 6 | 117 | PLATE-LIKE | 1100 | YES | 1.51E+07 |
| SAMPLE 7 | 10 | PLATE-LIKE | 1200 | NO | 1.20E+05 |
| SAMPLE 8 | 21 | PLATE-LIKE | 1200 | NO | 5.29E+05 |
| SAMPLE 9 | 47 | PLATE-LIKE | 1200 | NO | 2.65E+06 |
| SAMPLE 10 | 63 | PLATE-LIKE | 1200 | NO | 4.76E+06 |
| SAMPLE 11 | 85 | PLATE-LIKE | 1200 | NO | 8.67E+06 |
| SAMPLE 12 | 117 | PLATE-LIKE | 1200 | YES | 1.64E+07 |
| SAMPLE 13 | 10 | PLATE-LIKE | 1250 | NO | 1.25E+05 |
| SAMPLE 14 | 21 | PLATE-LIKE | 1250 | NO | 5.51E+05 |
| SAMPLE 15 | 47 | PLATE-LIKE | 1250 | NO | 2.76E+06 |
| SAMPLE 16 | 63 | PLATE-LIKE | 1250 | NO | 4.96E+06 |
| SAMPLE 17 | 85 | PLATE-LIKE | 1250 | YES | 9.03E+06 |
| SAMPLE 18 | 117 | PLATE-LIKE | 1250 | YES | 1.71E+07 |
| SAMPLE 19 | 10 | PLATE-LIKE | 1300 | NO | 1.30E+05 |
| SAMPLE 20 | 21 | PLATE-LIKE | 1300 | NO | 5.73E+05 |
| SAMPLE 21 | 47 | PLATE-LIKE | 1300 | NO | 2.87E+06 |
| SAMPLE 22 | 63 | PLATE-LIKE | 1300 | NO | 5.16E+06 |
| SAMPLE 23 | 85 | PLATE-LIKE | 1300 | YES | 9.39E+06 |
| SAMPLE 24 | 117 | PLATE-LIKE | 1300 | YES | 1.78E+07 |
| SAMPLE 25 | 45 | POLYHEDRON | 1100 | NO | 2.23E+06 |
| SAMPLE 26 | 67 | POLYHEDRON | 1100 | NO | 4.94E+06 |
| SAMPLE 27 | 115 | POLYHEDRON | 1100 | NO | 1.45E+07 |
| SAMPLE 28 | 45 | POLYHEDRON | 1200 | NO | 2.43E+06 |
| SAMPLE 29 | 67 | POLYHEDRON | 1200 | NO | 5.39E+06 |
| SAMPLE 30 | 115 | POLYHEDRON | 1200 | NO | 1.59E+07 |
| SAMPLE 31 | 45 | POLYHEDRON | 1250 | NO | 2.53E+06 |
| SAMPLE 32 | 67 | POLYHEDRON | 1250 | NO | 5.61E+06 |
| SAMPLE 33 | 115 | POLYHEDRON | 1250 | NO | 1.65E+07 |

Example 2

The following wafers were prepared: a 300 mm epitaxial wafer in which an epitaxial layer was formed on a wafer doped with nitrogen, and a 300 mm epitaxial wafer in which an epitaxial layer was formed on a wafer doped with boron. The doping amounts are shown in Table 2. The interstitial oxygen concentration of the wafer of each sample was $11.5\times10^{17}$ to $13.6\times10^{17}$ atoms/cm$^3$.

The epitaxial wafers were inserted into a vertical furnace kept at 700° C. After the temperature was increased to a predetermined temperature at a predetermined rate, the temperature was kept for a predetermined period of time. For each sample, the temperature-rising rate, retention temperature, and retention time are shown in Table 2. After the thermal treatment, the temperature was lowered to 700° C. at a temperature-lowering rate of 3° C. per minute, and the wafers were taken out. In this manner, precipitate nuclei were formed on the wafer bodies. However, the above thermal treatment was omitted for Samples 34 and 41.

Then, the precipitate nuclei grew as thermal treatment was carried out on each sample at 850° C. for 30 minutes, at 900° C. for 30 minutes, at 1,000° C. for 100 minutes, and then at 950° C. for 30 minutes. The thermal treatment here was modeled after thermal treatment applied in manufacturing processes of advanced logic-based device.

To each sample, the LSA treatment was applied under the following condition:

$$T \times S^2 > 9 \times 10^6$$

After the LSA treatment, the shapes of oxygen precipitates were observed under a transmission electron microscope (TEM). Moreover, an X-ray topography device was used to confirm whether or not dislocation had occurred.

As a result, as shown in Table 2, in Samples 34 and 41 for which the thermal treatment for forming precipitate nuclei was omitted, as well as in Samples 35 and 42 whose temperature-rising rates were set to less than 5° C. per minute in the thermal treatment that may form precipitate nuclei, oxygen precipitates were in a plate-like shape, and it was confirmed that dislocation was caused by the LSA treatment. In the other samples whose temperature-rising rates were greater than or equal to 5° C. per minute, oxygen precipitates were in a polyhedron shape, and it was confirmed that dislocation did not occur even after the LSA treatment. The experiment therefore proved that, if the temperature-rising rate is greater than or equal to 5° C. per minute in the thermal treatment that may form precipitate nuclei, polyhedron oxygen precipitates become predominant.

TABLE 2

| | WAFER TYPE | TEMPERATURE-RISING RATE (° C./min) | RETENTION TEMPERATURE (° C.) | RETENTION TIME (min) | PRECIPITATE TYPE | DISLOCATION |
|---|---|---|---|---|---|---|
| SAMPLE 34 | NITROGEN DOPED ($1.5 \times 10^{13}$ atoms/cm$^3$) | — | — | — | PLATE-LIKE | YES |
| SAMPLE 35 | NITROGEN DOPED ($1.5 \times 10^{13}$ atoms/cm$^3$) | 3.5 | 1050 | 60 | PLATE-LIKE | YES |
| SAMPLE 36 | NITROGEN DOPED ($1.5 \times 10^{13}$ atoms/cm$^3$) | 5 | 1050 | 60 | POLYHEDRON | NO |
| SAMPLE 37 | NITROGEN DOPED ($1.5 \times 10^{13}$ atoms/cm$^3$) | 5 | 1050 | 10 | POLYHEDRON | NO |
| SAMPLE 38 | NITROGEN DOPED ($1.5 \times 10^{13}$ atoms/cm$^3$) | 10 | 1200 | 5 | POLYHEDRON | NO |
| SAMPLE 39 | NITROGEN DOPED ($3.4 \times 10^{14}$ atoms/cm$^3$) | 5 | 1050 | 60 | POLYHEDRON | NO |
| SAMPLE 40 | NITROGEN DOPED ($3.4 \times 10^{14}$ atoms/cm$^3$) | 10 | 1200 | 5 | POLYHEDRON | NO |
| SAMPLE 41 | BORON DOPED (18 mΩ · cm) | — | — | — | PLATE-LIKE | YES |
| SAMPLE 42 | BORON DOPED (18 mΩ · cm) | 3.5 | 1050 | 60 | PLATE-LIKE | YES |
| SAMPLE 43 | BORON DOPED (18 mΩ · cm) | 5 | 1050 | 60 | POLYHEDRON | NO |
| SAMPLE 44 | BORON DOPED (6 mΩ · cm) | 5 | 1050 | 60 | POLYHEDRON | NO |
| SAMPLE 45 | BORON DOPED (6 mΩ · cm) | 10 | 1200 | 5 | POLYHEDRON | NO |

Example 3

The following wafers were prepared: a 300 mm epitaxial wafer in which an epitaxial layer was formed on a wafer doped with nitrogen, and a 300 mm epitaxial wafer in which an epitaxial layer was formed on a wafer doped with boron. The doping amounts are shown in Table 3. The interstitial oxygen concentration of the wafer of each sample was $11.5\times10^{17}$ to $13.6\times10^{17}$ atoms/cm$^3$.

The epitaxial wafers were inserted into a vertical furnace kept at 700° C. After the temperature was increased to a predetermined temperature at a rate of 5° C. per minute, the temperature was kept for 5 minutes. For each sample, the retention temperature is shown in Table 3. After the thermal treatment, the temperature was lowered to 700° C. at a temperature-lowering rate of 3° C. per minute, and the wafers were taken out. In this manner, precipitate nuclei were formed on the wafer bodies.

Then, the precipitate nuclei grew as thermal treatment was carried out on each sample at 850° C. for 30 minutes, at 900° C. for 30 minutes, at 1,000° C. for 100 minutes, and then at 950° C. for 30 minutes.

To each sample, the LSA treatment was applied under the following condition:

$$T \times S^2 > 9 \times 10^6$$

After the LSA treatment, the shapes of oxygen precipitates were observed under a transmission electron microscope (TEM). Moreover, an X-ray topography device was used to confirm whether or not dislocation had occurred.

As a result, as shown in Table 3, in Samples 46, 47, 50 and 51 whose retention temperatures are less than 1050° C., oxygen precipitates were in a plate-like shape, and it was confirmed that dislocation was caused by the LSA treatment. On the other hand, in Samples 48, 49, 52 and 53 whose retention temperatures are greater than or equal to 1050° C., oxygen precipitates were in a polyhedron shape, and it was confirmed that dislocation did not occur even after the LSA treatment. The experiment therefore proved that, if the retention temperatures is greater than or equal to 1050° C. in the thermal treatment that may form precipitate nuclei, polyhedron oxygen precipitates become predominant.

temperature was lowered to 700° C. at a temperature-lowering rate of 3° C. per minute, and the wafers were taken out. In this manner, precipitate nuclei were formed on the wafer bodies.

Then, the precipitate nuclei grew as thermal treatment was carried out on each sample at 850° C. for 30 minutes, at 900° C. for 30 minutes, at 1,000° C. for 100 minutes, and then at 950° C. for 30 minutes.

To each sample, the LSA treatment was applied under the following condition:

$$T \times S^2 > 9 \times 10^6$$

After the LSA treatment, the shapes of oxygen precipitates were observed under a transmission electron micro-

TABLE 3

| | WAFER TYPE | TEMPERATURE-RISING RATE (° C./min) | RETENTION TEMPERATURE (° C.) | RETENTION TIME (min) | PRECIPITATE TYPE | DISLOCATION |
|---|---|---|---|---|---|---|
| SAMPLE 46 | NITROGEN DOPED ($1.5 \times 10^{13}$ atoms/cm$^3$) | 5 | 950 | 5 | PLATE-LIKE | YES |
| SAMPLE 47 | NITROGEN DOPED ($1.5 \times 10^{13}$ atoms/cm$^3$) | 5 | 1025 | 5 | PLATE-LIKE | YES |
| SAMPLE 48 | NITROGEN DOPED ($1.5 \times 10^{13}$ atoms/cm$^3$) | 5 | 1050 | 5 | POLYHEDRON | NO |
| SAMPLE 49 | NITROGEN DOPED ($1.5 \times 10^{13}$ atoms/cm$^3$) | 5 | 1075 | 5 | POLYHEDRON | NO |
| SAMPLE 50 | BORON DOPED (8 mΩ · cm) | 5 | 950 | 5 | PLATE-LIKE | YES |
| SAMPLE 51 | BORON DOPED (8 mΩ · cm) | 5 | 1025 | 5 | PLATE-LIKE | YES |
| SAMPLE 52 | BORON DOPED (8 mΩ · cm) | 5 | 1050 | 5 | POLYHEDRON | NO |
| SAMPLE 53 | BORON DOPED (8 mΩ · cm) | 5 | 1075 | 5 | POLYHEDRON | NO |

Example 4

The following wafers were prepared: a 300 mm epitaxial wafer in which an epitaxial layer was formed on a wafer doped with nitrogen, and a 300 mm epitaxial wafer in which an epitaxial layer was formed on a wafer doped with boron. The doping amounts are shown in Table 4. The interstitial oxygen concentration of the wafer of each sample was $11.5 \times 10^{17}$ to $13.6 \times 10^{17}$ atoms/cm$^3$.

The epitaxial wafers were inserted into a vertical furnace kept at 700° C. After the temperature was increased to 1050° C. at a rate of 5° C. per minute, the temperature was kept for predetermined period. For each sample, the retention temperature is shown in Table 4. After the thermal treatment, the scope (TEM). Moreover, an X-ray topography device was used to confirm whether or not dislocation had occurred.

As a result, as shown in Table 4, in Samples 54, 55, 58 and 59 whose retention time are less than 5 minutes, oxygen precipitates were in a plate-like shape, and it was confirmed that dislocation was caused by the LSA treatment. On the other hand, in Samples 56, 57, 60 and 61 whose retention time are greater than or equal to 5 minutes, oxygen precipitates were in a polyhedron shape, and it was confirmed that dislocation did not occur even after the LSA treatment. The experiment therefore proved that, if the retention time is greater than or equal to 5 minutes in the thermal treatment that may form precipitate nuclei, polyhedron oxygen precipitates become predominant.

TABLE 4

| | WAFER TYPE | TEMPERATURE-RISING RATE (° C./min) | RETENTION TEMPERATURE (° C.) | RETENTION TIME (min) | PRECIPITATE TYPE | DISLOCATION |
|---|---|---|---|---|---|---|
| SAMPLE 54 | NITROGEN DOPED ($1.5 \times 10^{13}$ atoms/cm$^3$) | 5 | 1050 | 2 | PLATE-LIKE | YES |
| SAMPLE 55 | NITROGEN DOPED ($1.5 \times 10^{13}$ atoms/cm$^3$) | 5 | 1050 | 4 | PLATE-LIKE | YES |
| SAMPLE 56 | NITROGEN DOPED ($1.5 \times 10^{13}$ atoms/cm$^3$) | 5 | 1050 | 5 | POLYHEDRON | NO |
| SAMPLE 57 | NITROGEN DOPED ($1.5 \times 10^{13}$ atoms/cm$^3$) | 5 | 1050 | 10 | POLYHEDRON | NO |
| SAMPLE 58 | BORON DOPED (8 mΩ · cm) | 5 | 1050 | 2 | PLATE-LIKE | YES |
| SAMPLE 59 | BORON DOPED (8 mΩ · cm) | 5 | 1050 | 4 | PLATE-LIKE | YES |
| SAMPLE 60 | BORON DOPED (8 mΩ · cm) | 5 | 1050 | 5 | POLYHEDRON | NO |

TABLE 4-continued

| WAFER TYPE | | TEMPERATURE-RISING RATE (° C./min) | RETENTION TEMPERATURE (° C.) | RETENTION TIME (min) | PRECIPITATE TYPE | DISLOCATION |
|---|---|---|---|---|---|---|
| SAMPLE 61 | BORON DOPED (8 mΩ · cm) | 5 | 1050 | 10 | POLYHEDRON | NO |

Example 5

The following wafers were prepared: a 300 mm epitaxial wafer in which an epitaxial layer was formed on a wafer doped with nitrogen, and a 300 mm epitaxial wafer in which an epitaxial layer was formed on a wafer doped with boron. The doping amounts are different from each samples. The interstitial oxygen concentration of the wafer of each sample was $11.5 \times 10^{17}$ to $13.6 \times 10^{17}$ atoms/cm$^3$.

Then, the precipitate nuclei grew as thermal treatment was carried out on each sample at 850° C. for 30 minutes, at 900° C. for 30 minutes, at 1,000° C. for 100 minutes, and then at 950° C. for 30 minutes. In this example, a thermal treatment was omitted before growing the precipitate nuclei.

To each sample, the LSA treatment was applied under the following condition:

$$T \times S^2 > 9 \times 10^6$$

After the LSA treatment, the shapes of oxygen precipitates were observed under a transmission electron microscope (TEM). Moreover, an X-ray topography device was used to confirm whether or not dislocation had occurred.

As a result, in samples whose nitrogen concentration was less than $1 \times 10^{12}$ atoms/cm$^3$, as well as in samples whose specific resistance associated with boron doping was over 20 mΩ·cm, despite the fact that oxygen precipitates were in a plate-like shape, dislocation did not occur even after the LSA treatment. In samples whose nitrogen concentration was greater than or equal to $1 \times 10^{12}$ atoms/cm$^3$, as well as in samples whose specific resistance associated with boron doping was less than or equal to 20 mΩ·cm dislocation occurred after the LSA treatment. The experiment therefore proved that, after the LSA treatment, dislocation occurs on a silicon wafer whose nitrogen concentration is greater than or equal to $1 \times 10^{12}$ atoms/cm$^3$, or a silicon wafer whose specific resistance associated with boron doping is less than or equal to 20 mΩ·cm; and that, on a silicon wafer whose nitrogen concentration is less than $1 \times 10^{12}$ atoms/cm$^3$, or a silicon wafer whose specific resistance associated with boron doping is over 20 mΩ·cm, dislocation does not occur even after the LSA treatment.

Example 6

A plurality of the following epitaxial wafers were prepared: an epitaxial wafer in which an epitaxial film was formed on a surface of a wafer whose nitrogen concentration was $3 \times 10^{13}$ to $6 \times 10^{13}$ atoms/cm$^3$; and an epitaxial wafer in which an epitaxial film was formed on a surface of a wafer whose specific resistance associated with boron doping was 6 to 8 mΩ·cm. The initial oxygen concentration of each wafer is shown in Table 5.

Then, precipitate nuclei of plate-like oxygen precipitates grew as thermal treatment was carried out on some of the samples at 850° C. for 30 minutes, at 900° C. for 30 minutes, at 1,000° C. for 100 minutes, and then at 950° C. for 30 minutes (Thermal treatment A). On the remaining samples, thermal treatment was carried out at 750° C. for 45 minutes, at 900° C. for 30 minutes, at 1,050° C. for 120 minutes, and then at 950° C. for 45 minutes (Thermal treatment B), and precipitate nuclei of plate-like oxygen precipitates grew as a result. The two types of thermal treatment, A and B, were modeled after thermal treatment applied in manufacturing processes of advanced logic-based device.

Then, on each sample, the LSA treatment was carried out under the following condition: Maximum temperature T of 1,250° C. After the LSA treatment, the sizes of plate-like oxygen precipitates that existed in a region extending to a depth of 50 μm or less from the outer layer of the wafer were observed under a transmission electron microscope (TEM). Moreover, an X-ray topography device was used to confirm whether or not dislocation had occurred.

As a result, as shown in Table 5, when the value given by $T \times S^2$ was less than or equal to $9 \times 10^6$, dislocation did not occur regardless of the type of the wafer (nitrogen or boron doping), as well as of the type of thermal treatment performed in advance (thermal treatment A or B). However, in Samples 67, 72 to 74, 79, and 84, in which case the value given by $T \times S^2$ was over to $9 \times 10^6$, dislocation had occurred.

Among the nitrogen-doped epitaxial wafers that were subjected to thermal treatment A, in Sample 66 whose initial oxygen concentration was $13.6 \times 10^{17}$ atoms/cm$^3$, dislocation did not occur; however, in Sample 67 whose initial oxygen concentration was $14.5 \times 10^{17}$ atoms/cm$^3$, dislocation occurred. Furthermore, among the nitrogen-doped epitaxial wafers that were subjected to thermal treatment B, in Sample 71 whose initial oxygen concentration was $11.8 \times 10^{17}$ atoms/cm$^3$, dislocation did not occur; however, in Sample 72 whose initial oxygen concentration was $12.5 \times 10^{17}$ atoms/cm$^3$, dislocation occurred.

Among the boron-doped epitaxial wafers that were subjected to thermal treatment A, in Sample 78 whose initial oxygen concentration was $13.0 \times 10^{17}$ atoms/cm$^3$, dislocation did not occur; however, in Sample 79 whose initial oxygen concentration was $13.6 \times 10^{17}$ atoms/cm$^3$, dislocation occurred. Furthermore, among the boron-doped epitaxial wafers that were subjected to thermal treatment B, in Sample 83 whose initial oxygen concentration was $12.0 \times 10^{17}$ atoms/cm$^3$, dislocation did not occur; however, in Sample 84 whose initial oxygen concentration was $12.6 \times 10^{17}$ atoms/cm$^3$, dislocation occurred.

The above results have confirmed that, when the same level of thermal treatment as thermal treatment A is performed before the LSA treatment, regardless of whether the wafers are doped with nitrogen or boron, dislocation does not occur in the LSA treatment whose maximum temperature is 1,250° C. if the initial oxygen concentration is less than or equal to $14 \times 10^{17}$ atoms/cm$^3$. The above results also have confirmed that, when the same level of thermal treatment as thermal treatment B is performed before the LSA treatment, regardless of whether the wafers are doped with nitrogen or boron, dislocation does not occur in the LSA treatment whose maximum temperature is 1,250° C. if the initial oxygen concentration is less than or equal to $12 \times 10^{17}$ atoms/cm$^3$.

TABLE 5

| WAFER TYPE | | INITIAL OXYGEN CONCENTRATION ($\times 10^{17}$ atoms/cm$^3$) | TYPE OF THERMAL TREATMENT | SIZE OF OXYGEN PRECIPITATES S (nm) | MAXIMUM TEMPERATURE OF THE LSA TREATMENT T (° C.) | DISLOCATION | S$^2$*T |
|---|---|---|---|---|---|---|---|
| SAMPLE 62 | NITROGEN DOPED | 9.3 | A | 31 | 1250 | NO | 1.20E+06 |
| SAMPLE 63 | NITROGEN DOPED | 10.5 | A | 42 | 1250 | NO | 2.21E+06 |
| SAMPLE 64 | NITROGEN DOPED | 11.8 | A | 54 | 1250 | NO | 3.65E+06 |
| SAMPLE 65 | NITROGEN DOPED | 12.5 | A | 62 | 1250 | NO | 4.81E+06 |
| SAMPLE 66 | NITROGEN DOPED | 13.6 | A | 78 | 1250 | NO | 7.61E+06 |
| SAMPLE 67 | NITROGEN DOPED | 14.5 | A | 86 | 1250 | YES | 9.25E+06 |
| SAMPLE 68 | NITROGEN DOPED | 8.2 | B | 42 | 1250 | NO | 2.21E+06 |
| SAMPLE 69 | NITROGEN DOPED | 9.3 | B | 53 | 1250 | NO | 3.51E+06 |
| SAMPLE 70 | NITROGEN DOPED | 10.5 | B | 59 | 1250 | NO | 4.35E+06 |
| SAMPLE 71 | NITROGEN DOPED | 11.8 | B | 68 | 1250 | NO | 5.78E+06 |
| SAMPLE 72 | NITROGEN DOPED | 12.5 | B | 85 | 1250 | YES | 9.03E+06 |
| SAMPLE 73 | NITROGEN DOPED | 13.6 | B | 98 | 1250 | YES | 1.20E+07 |
| SAMPLE 74 | NITROGEN DOPED | 14.5 | B | 123 | 1250 | YES | 1.89E+07 |
| SAMPLE 75 | BORON DOPED | 8.3 | A | 11 | 1250 | NO | 1.51E+05 |
| SAMPLE 76 | BORON DOPED | 10.1 | A | 35 | 1250 | NO | 1.53E+06 |
| SAMPLE 77 | BORON DOPED | 12.6 | A | 56 | 1250 | NO | 3.92E+06 |
| SAMPLE 78 | BORON DOPED | 13.0 | A | 64 | 1250 | NO | 5.12E+06 |
| SAMPLE 79 | BORON DOPED | 13.6 | A | 86 | 1250 | YES | 9.25E+06 |
| SAMPLE 80 | BORON DOPED | 8.3 | B | 14 | 1250 | NO | 2.45E+05 |
| SAMPLE 81 | BORON DOPED | 10.1 | B | 42 | 1250 | NO | 2.21E+06 |
| SAMPLE 82 | BORON DOPED | 11.5 | B | 52 | 1250 | NO | 3.38E+06 |
| SAMPLE 83 | BORON DOPED | 12.0 | B | 69 | 1250 | NO | 5.95E+06 |
| SAMPLE 84 | BORON DOPED | 12.6 | B | 89 | 1250 | YES | 9.90E+06 |

What is claimed is:

1. A method of manufacturing an epitaxial wafer, the method comprising:
    forming an epitaxial layer on a silicon wafer, in which a nitrogen concentration is $1\times10^{12}$ atoms/cm$^3$ or more or a specific resistance is 20 mΩ·cm or less by boron doping, to form the epitaxial wafer; and
    heating the epitaxial wafer by raising a temperature of the epitaxial wafer to a predetermined temperature at a rate of 5 ° C. per minute or more within a temperature range from 800° C. to the predetermined temperature and keeping the predetermined temperature for 5 minutes or more, the predetermined temperature being greater than or equal to 1,050° C. and less than or equal to a melting point of silicon,
    wherein the epitaxial wafer is subjected to device processes including a LSA (Laser Spike Anneal) treatment after the heating.

2. The method of manufacturing the epitaxial wafer as claimed in claim 1, wherein the LSA treatment is performed under a condition indicated by $$T \times S^2 \leq 9 \times 10^6$$

where an average value of diagonal lengths of plate-like oxygen precipitates contained in the silicon wafer with the epitaxial layer formed thereon is represented by S (nm), and a maximum temperature of the LSA treatment is represented by T (° C.).

3. The method of manufacturing the epitaxial wafer as claimed in claim 1, the method further comprising:
    growing a silicon single crystal in which an initial oxygen concentration is $14\times10^{17}$ atoms/cm$^3$ or less by means of a Czochralski method; and
    obtaining the silicon wafer by cutting out from the silicon single crystal.

4. The method of manufacturing the epitaxial wafer as claimed in claim 3, wherein the initial oxygen concentration is $12\times10^{17}$ atoms/cm$^3$ or less.

5. The method of manufacturing the epitaxial wafer as claimed in claim 4, wherein the device processes further include a thermal treatment to the epitaxial wafer with a temperature of 750° C. or more for 4 hours or more performed before the LSA treatment, the thermal treatment including a process in which the epitaxial wafer is kept at a temperature range of 1,000 to 1,050° C. for 2 hours or more.

6. A method of manufacturing a semiconductor device, the method comprising a wafer process of forming an epitaxial wafer, and a device process of forming the semiconductor device on the epitaxial wafer,
    wherein the wafer process includes:
    forming an epitaxial layer on a silicon wafer, in which a nitrogen concentration is $1\times10^{12}$ atoms/cm$^3$ or more or a specific resistance is 20 mΩ·cm or less by boron doping, to form the epitaxial wafer; and
    heating the epitaxial wafer by raising a temperature of the epitaxial wafer to a predetermined temperature at a rate of 5° C. per minute or more within a temperature range from 800° C. to the predetermined temperature and keeping the predetermined temperature for 5 minutes or more, the predetermined temperature being greater than or equal to 1,050° C. and less than or equal to a melting point of silicon,
    wherein the device process includes a LSA (Laser Spike Anneal) treatment performed under a condition indicated by $$T \times S^2 \leq 9 \times 10^6$$

where an average value of diagonal lengths of plate-like oxygen precipitates contained in the silicon wafer with the epitaxial layer formed thereon is represented by S (nm), and a maximum temperature of the LSA treatment is represented by T (° C.).

7. A method of manufacturing a semiconductor device, the method comprising:
    forming an epitaxial layer on a silicon wafer to form an epitaxial wafer;
    forming oxygen precipitate nuclei in the silicon wafer with the epitaxial layer formed thereon;

growing the oxygen precipitate nuclei to form larger amounts of polyhedron oxygen precipitates than plate-like oxygen precipitates; and performing a LSA (Laser Spike Anneal) treatment after the growing, wherein the forming of the oxygen precipitate nuclei is performed by heating the epitaxial wafer by raising a temperature of the epitaxial wafer to a predetermined temperature at a rate of 5° C. per minute or more within a temperature range from 800° C. to the predetermined temperature and keeping the predetermined temperature for 5 minutes or more, the predetermined temperature being greater than or equal to 1,050° C. and less than or equal to a melting point of silicon.

8. The method of manufacturing the semiconductor device as claimed in claim 7, wherein the growing is performed by a thermal treatment to the epitaxial wafer with a temperature of 750° C. or more for 4 hours or more, the thermal treatment including a process in which the epitaxial wafer is kept at a temperature range of 1,000 to 1,050° C. for 2 hours or more.

9. The method of manufacturing the semiconductor device as claimed in claim 7, wherein the LSA treatment is performed under a condition indicated by $$T \times S^2 \leq 9 \times 10^6$$

where an average value of diagonal lengths of plate-like oxygen precipitates contained in the silicon wafer with the epitaxial layer formed thereon is represented by S (nm), and a maximum temperature of the LSA treatment is represented by T (° C.).

10. A method of manufacturing a semiconductor device, the method comprising:

preparing a silicon wafer including a plurality of plate-like oxygen precipitates; and performing a LSA (Laser Spike Anneal) treatment to the silicon wafer under a condition indicated by $$T \times S^2 9 \times 10^6$$

where an average value of diagonal lengths of the plate-like oxygen precipitates is represented by S (nm), and a maximum temperature of the LSA treatment is represented by T (° C.).

11. The method of manufacturing the semiconductor device as claimed in claim 10, wherein the silicon wafer has an epitaxial layer.

12. The method of manufacturing the semiconductor device as claimed in claim 10, wherein the preparing the silicon wafer includes:

growing a silicon single crystal in which an initial oxygen concentration is $14 \times 10^{17}$ atoms/cm$^3$ or less by means of a Czochralski method; and obtaining the silicon wafer by cutting out from the silicon single crystal.

13. The method of manufacturing the semiconductor device as claimed in claim 12, wherein the initial oxygen concentration is $12 \times 10^{17}$ atoms/cm$^3$ or less.

14. The method of manufacturing the semiconductor device as claimed in claim 13, the method further comprising:

performing a thermal treatment to the silicon wafer with a temperature of 750° C. or more for 4 hours or more before the LSA treatment, the thermal treatment including a process in which the silicon wafer is kept at a temperature range of 1,000 to 1,050° C. for 2 hours or more.

* * * * *

UNITED STATES PATENT AND TRADEMARK OFFICE
CERTIFICATE OF CORRECTION

PATENT NO.        : 9,502,266 B2                                          Page 1 of 1
APPLICATION NO.   : 13/576853
DATED             : November 22, 2016
INVENTOR(S)       : T. Ono et al.

It is certified that error appears in the above-identified patent and that said Letters Patent is hereby corrected as shown below:

In the Claims

Column 22, Line 7 (Claim 10, Line 7) please change "$S_2 9$" to -- $S_2 \leq 9$ --

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*